United States Patent

Estreicher et al.

[11] 4,071,397
[45] Jan. 31, 1978

[54] SILICON METALLOGRAPHIC ETCH

[75] Inventors: Isabelle E. Estreicher; James B. Price, both of Phoenix, Ariz.

[73] Assignee: Motorola, Inc., Chicago, Ill.

[21] Appl. No.: 375,403

[22] Filed: July 2, 1973

[51] Int. Cl.$^2$ .................................. H01L 21/306
[52] U.S. Cl. ................................. 156/662; 252/79.3
[58] Field of Search ............. 156/17, 20, 662, 645; 252/79.3

[56] References Cited

U.S. PATENT DOCUMENTS

| | | | |
|---|---|---|---|
| 3,231,422 | 1/1966 | Emeis | 156/17 |
| 3,514,407 | 5/1970 | Missel | 156/20 |
| 3,775,200 | 11/1973 | de Noble et al. | 156/17 |
| 3,813,311 | 5/1974 | Beck et al. | 156/17 |
| 4,029,542 | 6/1977 | Swartz | 156/662 |

*Primary Examiner*—William A. Powell
*Assistant Examiner*—Jerome W. Massie
*Attorney, Agent, or Firm*—Lowell E. Clark

[57] ABSTRACT

A metallographic etch is disclosed which removes silicon at a very low rate. The removal of the silicon at a low rate means that the etch is highly controlled. Additional characteristics of the metallographic etch are that it is non-selective and it removes the silicon uniformly. Its special uses are related to an etch which is specially adapted for minimizing the $Q_{ss}$ charge on a silicon surface, as well as for removing work damage on wafers in which very shallow junction devices are to be formed.

12 Claims, 5 Drawing Figures

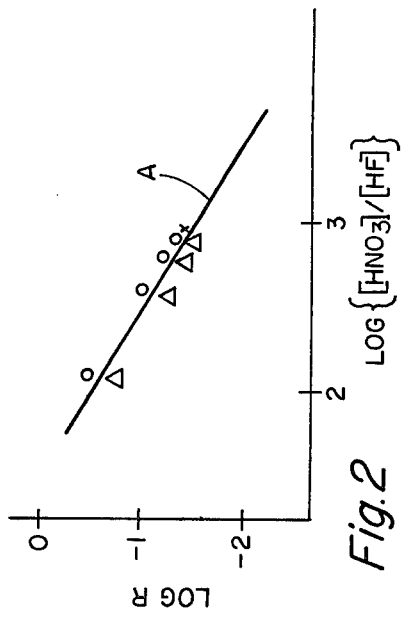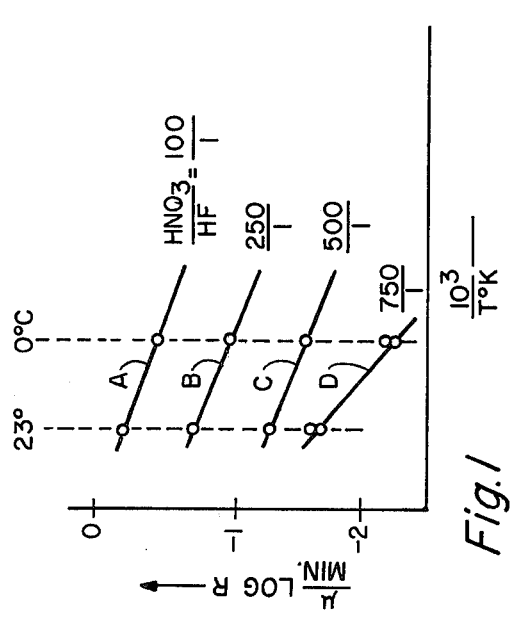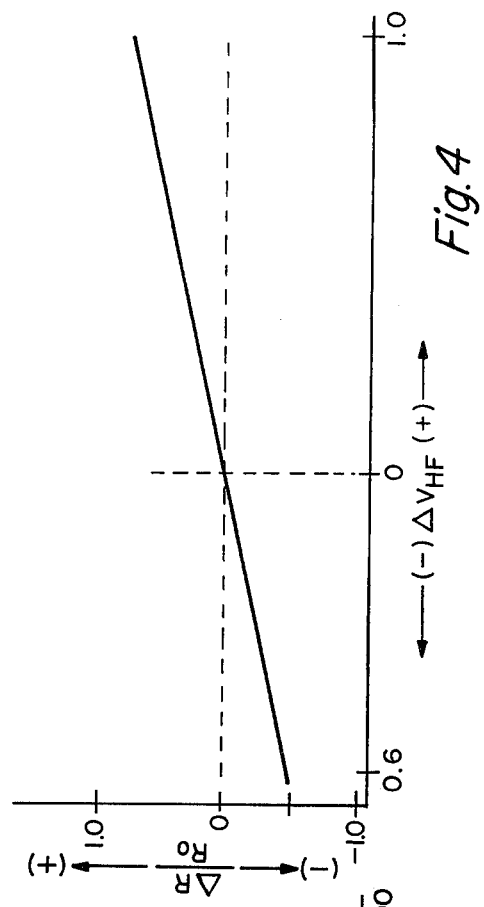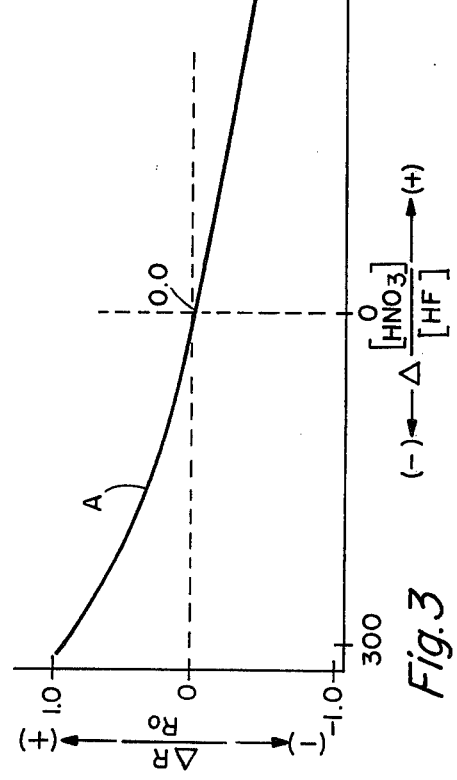
Fig.1
Fig.2
Fig.3
Fig.4

SILICON METALLOGRAPHIC ETCH

BACKGROUND OF THE INVENTION

Chemical or metallographic etches are well-known in the prior art including a standard etch which normally contains 5 parts of nitric acid, 1 part of hydrofluoric acid and 1 part of acetic acid. Such an etch removes up to several microns of silicon per minute. This etch has been used for many years in the semiconductor art and has been successful to the extent that substantially large quantities of silicon are to be removed. The standard etch textures the surface resulting in a loss of planarity. Therefore, the standard etch can be used when this loss of planarity will not be the limiting factor in the fabrication of devices on such wafers using the standard etch.

The basic constituents of the well-known etch have been thoroughly investigated for many years including such papers as an article entitled "Chemical Etching of Silicon, The System HF, $HNO_3$ and $H_2O$" in the Journal of the Electrochemical Society, of June 1959 beginning on page 505. An additional article is entitled "Chemical Etching of Silicon, A Temperature Study in the Acid System" written in the Journal of the Electrochemical Society, April of 1961, beginning at page 365. The third article entitled "Activation Energies in the Chemical Etching of Semiconductors in $HNO_3$—HF—$CH_3COOH$" written in the Journal of the Electrochemical Society Solid-States Science, September 1967 issue, beginning at page 970. All of these articles treat the etching of silicon using constituents including nitric acid and hydrofluoric acid. However, despite all this activity, these articles do not teach the use of a metallographic etch as hereinafter described for use in removing a limited amount of work damaged silicon at a controlled rate in order to minimize the surface charge on the wafer. The improved etch is especially adapted for use in MOS devices for stabilizing the surface charge $Q_{ss}$ and is especially adapted for removing work damage done by slurry polishing, or other polishing techniques, prior to the diffusion of the base junction on devices using very shallow junctions such as 0.6 micron for a base diffusion.

SUMMARY OF THE INVENTION

An object of the present invention is to provide for a new use for a metallographic etch for minimizing the surface charge on a silicon wafer.

Another object of the present invention is to provide a metallographic etch for removing work damage from a silicon surface without texturing the surface of the silicon wafer.

A still further object of the present invention is to find a metallographic etch for removing silicon material from a wafer at a low removal rate.

Another object of the present invention is to provide a metallographic etch which is non-selective and removes silicon in a uniform manner.

A still further object of the present invention is to provide a non-selective metallographic etch which removes silicon material in a uniform manner without texturing the surface of the silicon wafer.

Another object of the present invention is to find a metallographic etch which is able to remove a uniform amount of silicon at a low rate without complex equipment and in a manner which is non-hazardous.

A still further object of the present invention is to find a non-selective metallographic etch for removing silicon at a low rate from the surface of a silicon wafer damaged during wafer slicing and slurry polishing.

A still further object of the present invention is to provide a non-selective metallographic etch which removes the silicon caused by work damage after being accentuated by thermal oxidation.

Another object of the present invention is to provide a metallographic etch which uniformly removes silicon at a low rate of removal from silicon wafers having a crystallographic orientation along the (111) and (100) plane.

BRIEF DESCRIPTION OF THE FIGURES

FIG. 1 shows the temperature and composition dependences of the silicon etch rate in the $HNO_3$—HF mixture.

FIG. 2 shows the etch rate versus nitric to HF ratio at 25° C.

FIG. 3 shows the fractional change in etch rate versus change in nitric to HF ratio relative to a ratio of 750:1 at 25° C assuming that all of their parameters are held constant.

FIG. 4 shows the fractional change in etch rate versus change in volume of HF relative to the ratio of 750:1 at 25° C for a total volume of 1200 cc of etchant, assuming that all of their parameters are held constant.

Figure 5:
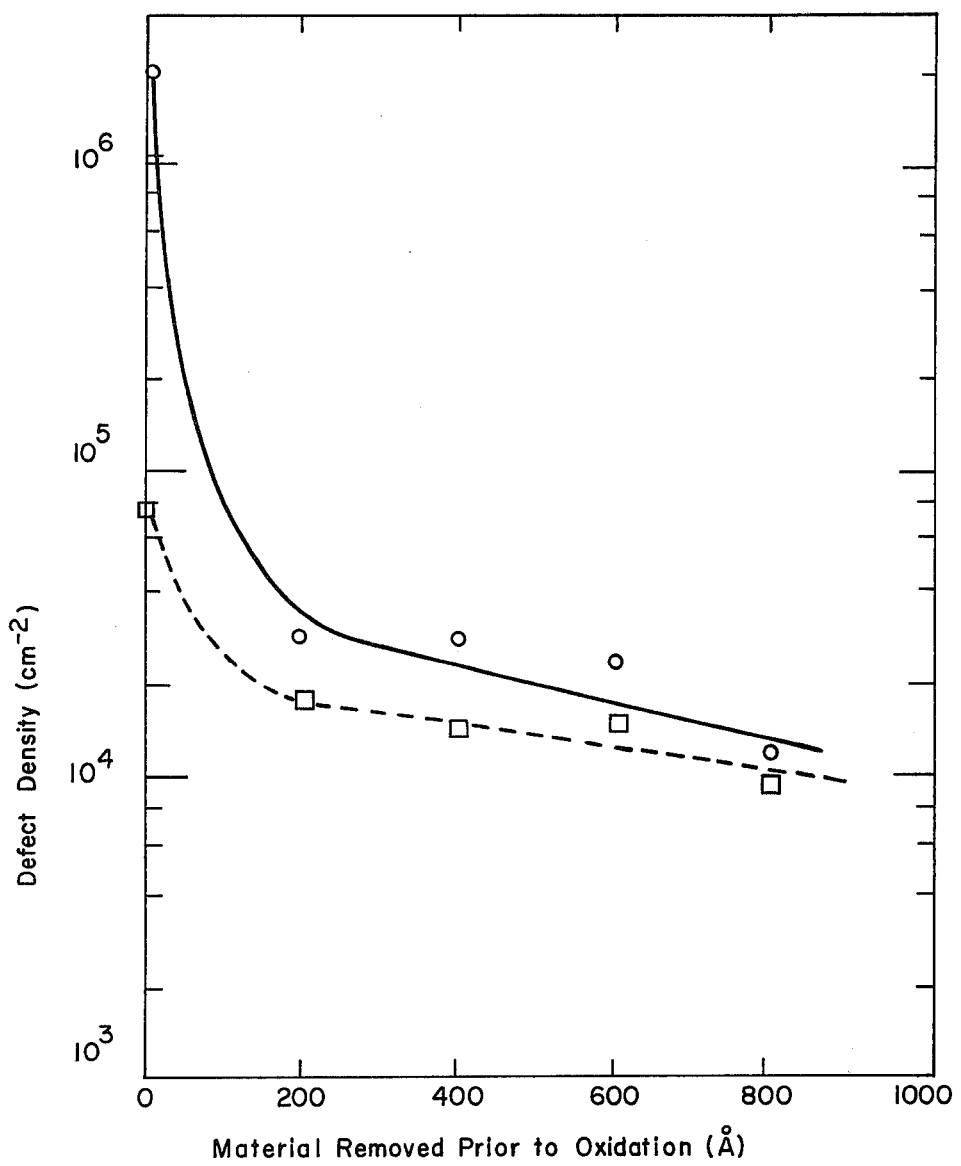
FIG. 5 shows the lowering of defect density according to the amount of silicon removed during the etching.

BRIEF DESCRIPTION OF THE INVENTION $HNO_3$—HF in the ratio of 750:1 etches (111) and (100) silicon at approximately 280 Angstroms/minute ±20 Angstroms at 25° C. A slurry polished wafer may be etched as much as 3000 Angstroms with this etchant without significant texturing. It has been found that etch removal of 500–800 Angstroms improves the surface condition of slurry polished silicon wafers.

The $HNO_3$—HF in the ratio of 750:1 etch reduces $Q_{ss}$ in silicon gate CMOS devices. This etchant also improves yields and reduces shorts in shallow junction bipolar devices. In general, the etch can be used whenever a uniform non-selective etch is needed; however, the very slow etch rate renders the present etchant specially adapted in those situations where only a small amount of material is to be removed. It has been found to be specially adapted for use in CMOS devices for stabilizing the $Q_{ss}$ of the silicon surface as well as in bipolar devices for use in structures having very shallow junctions. A shallow junction is deemed to be .6 microns for the base diffusion.

DETAILED DESCRIPTION OF THE INVENTION

Referring to FIG. 1 there is shown a graph showing the change in etch rate at two temperatures. One being within the range of 23° to 25° C and the other being substantially at 0° C. Line A shows an etch rate for the etchant having a ratio of $HNO_3$ to HF of 100:1. This shows a steadily declining etch rate for the two temperatures. Line B shows the etch rate for a $HNO_3$ to HF ratio of 250:1. Line C shows the etch rate for a ratio of $HNO_3$ to HF of 500:1. Line D shows the etch rate for an etchant having a ratio of 750:1 of $HNO_3$ to HF. The temperature of 23° C typically represents room temperature which lies with the range of 23° to 25° C.

Referring to FIG. 2 there is shown a composition dependence of the metallographic etch at room temperature which is well fitted by equation (1):

$$R = 138 \left[ \frac{(HNO_3)}{(HF)} \right]^{1.28} \quad (1)$$

Three different measurement techniques were used to establish the data shown in FIG. 2 for etch rates calculated during shallow etches of around 600 Angstroms, as well as with deep etches of around 50 microns. The circles represent data taken from deep etches of greater than 30 microns. The X represents data taken from shallow etches using a porfilometer to determine the depth of the etch. The triangles represent unpatterned etches using shallow etches using weight losses to calculate the depth of the etch. It is evident from the data shown in FIG. 2 that small errors in the preparation of the $HNO_3$—HF mixtures will alter the etch rate measurably. The etch depth is given as Rt, where D = Rt. D is the etch depth in microns, R is the etch rate in microns per minute and $t$ is the etch duration in minutes. The error in etch depth $\Delta D$, due to a fluctuation in etch rate $\Delta R$ is given by the following equation:

$$\Delta D = \frac{\Delta R}{R_0} \times D_0,$$

where $R_0$ and $D_0$ are the assumed etch rate and depth. The term ($\Delta R/R_0$) may be calculated as a function of $$\Delta \left[ \frac{(HNO_3)}{(HF)} \right]$$

with Equation 1.

Referring to FIG. 3, there can be seen the results of such computations. As FIG. 3 shows the fractional change in etch rate versus change in nitric to HF ratio relative to the 750:1 ratio at 25° C assuming that all of the parameters are held constant.

In one experiment a total volume of 1200 cc of the ($HNO_3$/HF) etch at a ratio of 750:1 was used with twenty, two-inch wafers. The useful lifetime is 200 wafer minutes or 6 cc per wafer minute. The volume, 1200 cc, contains 1.595 cc of HF and 1198.4 cc of $HNO_3$. An error of 1 cc of $HNO_3$ is insignificant, whereas a 1 cc error in HF will have measurable effect upon the silicon etch rate.

Referring to FIG. 4 there is shown a graph of ($\Delta R/R_0$) versus $\Delta V_{HF}$.

Referring to FIG. 5, there is shown the reduction of defects based upon the depth of the removal of the silicon material. The circles represent the change in density of defects removed from a wafer which was prepared by Lustrox Slurry Polish, while the squares represent the change in density of defects removed from a wafer which was prepared by the Lustrox Slurry Polish plus the Syton Slurry Polish.

The purpose of FIG. 5 is to show the reduction of surface defects after the removal of a predetermined amount of surface material. The graph shown in FIG. 5 was prepared using a plurality of different wafers. A number of wafers were polished by each of the identified polishing materials; thereafter different amounts of silicon were removed by the metallographic etch from individual wafers to the depths indicated; i.e., 0, 200A, 400A, 600A, and 800A. After this removal, the surface was oxidized to decorate the surface defects and make them easily identifiable. The surface oxide was removed and the number of surface defects were counted and the results were placed on the graph.

The metallographic etch described herein is adapted for special use as the etch prior to base diffusion for bipolar devices and prior to the growth of the gate oxide for MOS devices. It has given unusual improvement in a number of uses. While in general the composition of the metallographic etch can be used in all situations requiring a low etch rate, the disclosed mixture has given uniform removal performance without texturing up to the removal of 3000A of material during one run.

The use of the metallographic etch herein disclosed has been found to give unusual and unexpected results in the formation of shallow junction bipolar devices. In the manufacture of such shallow junction devices, the metallographic etch can be used at any one or a number of points within the process for giving improved results. Prior to initial oxidation, the metallographic etch can be used in removing work damage caused during the lapping and polishing of the wafer itself. The metallographic etch can be repeated just prior to base diffusion for removing damage caused during the formation of the initial oxide layer. Alternatively, the metallographic etch need not be used prior to initial oxidation but rather can be postponed and only one metallographic etch be used just prior to the base diffusion which will remove the damage caused during the lapping and polishing of the wafer as well as the damage caused during the initial oxidation. Another alternative is the use of the metallographic etch only on the lapped and polished wafer when a dry-low temperature process is used to form the initial oxide layer.

In actual operation there are many variables within the system. A brief reference to FIG. 1 shows that the etch rate or the removal of silicon material varies dependent upon the ratio of the $HNO_3$ to HF as well as varies according to the temperature of the etchant composition. Applicant has found through experimentation that the best results are achieved using a ratio of $HNO_3$ to HF which lies within the range of 600:1 and 750:1. A practical problem is illustrated referring to FIGS. 3 and 4 showing the various changes in etch rate according to the change in ratio of the etchant solution. Coordinates 0.00 indicate the center of the graph on FIG. 3, and represent the perfect ratio of $HNO_3$ to HF of 750:1. However, as a practical matter, a certain amount of error is introduced into the system by the individuals preparing the etchant solution by not perfectly measuring out exactly a perfect ratio of 750:1. An error of the type which would change the ratio to 300:1 is represented by a left-hand portion of the graph which shows an increase by a factor of 100% in the etch rate achieved by an error of $HNO_3$ to HF which reduces the ratio to 300:1. The right-hand portion of FIG. 3 shows that a change by a factor of 500:1 to a total of 1250:1 reduces the removal rate by a factor of 50%. This in effect slows down the removal rate.

Referring to FIG. 4, there is shown in different format the same information represented in FIG. 3. This graph bears on the question of the accuracy of mixing the metallographic etch to a perfect ratio of 750:1. FIG. 4 shows that a small error in the addition or subtraction of hydrofluoric acid to the basic solution which contains 1.595 cc of hydrofluoric and 1198.4 cc of nitric acid. If an error of .6 cc is made in not adding enough hydrofluoric acid to the basic solution of 1200 cc, the etch rate is reduced by a factor of approximately 50%. On the other hand, if an additional 1 cc of hydrofluoric acid is added, the etch rate increases by a factor of 80%. It has been found through experimentation that a metallographic etch having a ratio lying within the range of 600:1 to 750:1 will work very adequately for the special uses hereinbefore described. This will take into account the slight errors introduced into the mixing of the metallographic etch as shown with reference to FIGS. 3 and 4.

Referring briefly to FIG. 5, there is shown the reduction in surface defects based on the quantity of silicon material removed during the etch. FIG. 5 illustrates a levelling out of the effect of the metallographic etch after a total of 700-800 Angstroms of material have been removed. It has been found through experimentation that unusual results for the lowering of the surface charge as well as in the preparation of bipolar devices having shallow junctions that removing 700-1000 Angstroms of material will result in the improved characteristics of the MOS devices as well as increasing the yields of bipolar transistors having shallow junctions.

Accordingly, with all the data available, it has been determined that having a metallographic etch which has a ratio of nitric acid to hydrofluoric, which ratio lies within a range of 600:1 to 750:1 will result in operator error which lies within a controllable range such that an amount of silicon lying within the range of 700 Angstroms to 1000 Angstroms can be removed in a repetitive manner for use in both MOS structures and bipolar structures such that the results are highly reproducible for both bipolar transistors and MOS transistors.

What is claimed is:

1. A metallographic etch for use in the manufacture of semiconductor devices for the removal of work damaged silicon material at a uniform rate of 280A ±1% per minute, comprising:
a mixture of nitric acid to hydrofluoric acid having a ratio by volume of mixture lying within the range of 600:1 to 750:1 at a temperature within the range of 23° to 25° C.

2. In the manufacture of semiconductor devices for the removal of work damaged silicon wafer in a uniform and non-selective manner without texturing the surface of the silicon wafer, the process comprising the steps of:
removing less than 3000A of work damaged silicon using an etch of nitric acid and hydrofluoric acid having a ratio by volume of mixture lying within the range of 600:1 to 750:1.

3. In a process for use in the manufacture of MOS devices for stabilizing the threshold voltage of such a MOS device the improvement comprising the step of:
etching a lapped and polished wafer in which such MOS devices are built, in an etchant solution of a mixture of nitric acid and hydrofluoric acid having a ratio by volume of mixture lying within the range of 600:1 to 750:1 respectively.

4. The process as recited in claim 3 wherein the etchant removes silicon from the wafer to a depth lying within the range of 700 to 1000A.

5. A process as recited in claim 4, in which said etching step is completed prior to any other processing step on the lapped and polished wafer.

6. A process as recited in claim 4, in which said etching step is completed prior to the growth of the gate oxide on the wafer.

7. A process as recited in claim 5 in which said etching step is repeated just prior to the growth of the gate oxide on the wafer.

8. In a process for use in the manufacture of shallow base junction bipolar devices the improvement comprising the step of:
etching a lapped and polished wafer in which such bipolar devices are built in an etchant solution of a mixture of nitric acid and hydrofluoric acid having a ratio by volume of mixture lying within the range of 600:1 to 750:1, respectively.

9. A process as recited in claim 8, wherein the etchant removes silicon from the wafer to a depth lying within the range of 700A to 1000A.

10. A process as recited in claim 9, in which said etching step is completed prior to any other processing on the lapped and polished wafer.

11. A process as recited in claim 9, in which said etching step is completed just prior to the base diffusion.

12. A process as recited in claim 10, in which the etching step is repeated just prior to the base diffusion.

* * * * *